(12) United States Patent
Numoto

(10) Patent No.: US 6,656,026 B2
(45) Date of Patent: Dec. 2, 2003

(54) WAFER POLISHING APPARATUS

(75) Inventor: Minoru Numoto, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 40 days.

(21) Appl. No.: 10/014,456

(22) Filed: Dec. 14, 2001

(65) Prior Publication Data

US 2002/0081955 A1 Jun. 27, 2002

(30) Foreign Application Priority Data

Dec. 25, 2000 (JP) .......................................... 2000-392637

(51) Int. Cl.[7] ................................................. B24B 1/00
(52) U.S. Cl. ......................... 451/286; 451/41; 451/285; 451/287; 451/288; 451/397; 451/398
(58) Field of Search ........................... 451/41, 285, 286, 451/287, 288, 397, 398

(56) References Cited

U.S. PATENT DOCUMENTS 6,302,762 B1 * 10/2001 Inaba et al. ..................... 451/5
6,336,846 B1 * 1/2002 Park et al. ..................... 451/41
6,533,646 B2 * 3/2003 Volodarsky ................... 451/41

* cited by examiner

Primary Examiner—Joseph J. Hail, III
Assistant Examiner—Shantese McDonald
(74) Attorney, Agent, or Firm—Nixon Peabody LLP; David S. Safran

(57) ABSTRACT

In the wafer polishing apparatus for pressing a wafer against a polishing pad with an air bag, which is provided to a carrier, pressing area regulating members are attached to the bottom face of the carrier, whereby areas for pressing the wafer with the air bag are regulated. The pressing area regulating members are prepared in order to regulate different areas to be pressed. The areas for pressing the wafer with the air bag can be changed by replacing the pressing area regulating members when suitable.

5 Claims, 8 Drawing Sheets

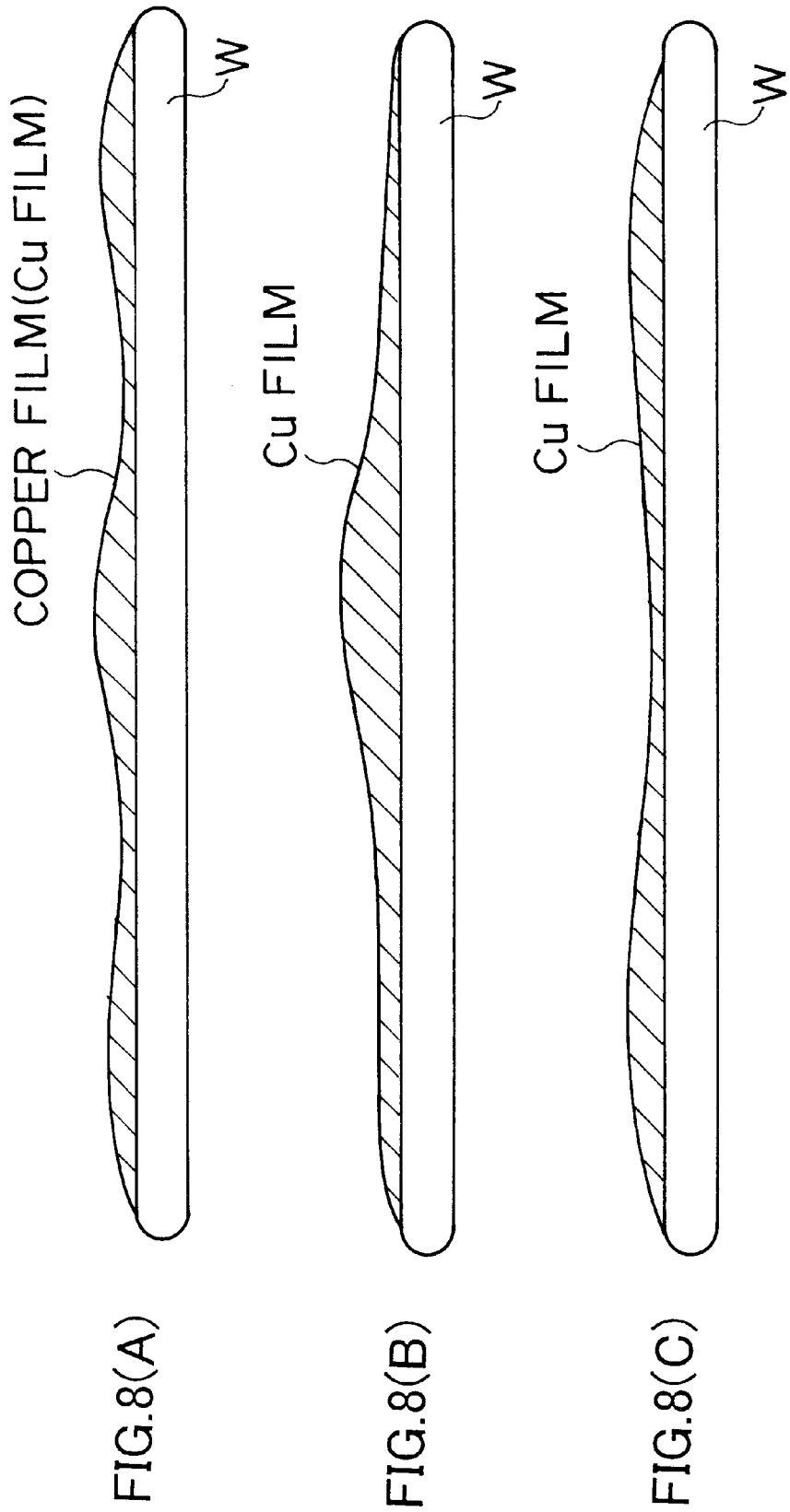

WAFER POLISHING APPARATUS

BACKGROUND OF THE INVENTION

1. Field of the Invention

The present invention relates to a wafer polishing apparatus which polishes a wafer by a Chemical Mechanical Planarizer (CMP).

2. Description of the Related Art

A film which is composed of copper (called a Cu film) and is polished by the CMP tends to be deposited at the center or at the outer periphery of a wafer W as seen in FIGS. 8(A), 8(B) and 8(C), since a current deposition technology yet remains to be improved. For that circumstances, there is a method for flattening the wafer having irregular film thicknesses by varying the pressing forces of a carrier at different areas. More specifically, machining amounts are made different depending on parts of the wafer by giving a variation in the pressing forces of the carrier at different areas thereof in order to make the thickness of the entire film uniform and at the same time remove a film of unnecessary parts of the wafer.

Japanese Patent Application Publication No. 9-225821 discloses a method in which plural openings for spouting compressed air to the bottom face of the carrier (i.e., a holding face of the wafer), and the plural openings are assigned to plural areas so as to supply the compressed air to the respective areas, whereby the pressing force is varied at different areas.

In another method, plural air bags that are assigned to plural areas are provided to the bottom of the carrier, and air bags for pressing the wafer have varied pressing forces for the respective areas to be pressed.

In the conventional methods, however, an entire carrier must be replaced by another after a pressure variation has been set once, in a case where the setting must be changed. Moreover, the respective air pressures must be balanced when uniformly pressing the entire wafer.

SUMMARY OF THE INVENTION

In view of the foregoing, it is an object of the present invention to provide a wafer polishing apparatus which is capable of easily changing an area for pressing the wafer.

In order to achieve the above-described object, the present invention provides a wafer polishing apparatus in which a wafer is pressed against a polishing pad so as to polish the wafer, comprising: a carrier; air spout openings provided to the bottom of said carrier, said air spout openings spouting air so as to form the air layer between said carrier and said wafer in order to press the wafer against the polishing pad by the air layer to polish the wafer; air bags provided to the bottom part of wafer carrier for forming said air layer and for partially pressing the top face of said wafer; and pressing area regulating members which are detachable from the bottom of said carrier for regulating an area where said air bag presses the top face of said wafer, wherein said pressing area regulating members regulate different areas to be pressed, and said pressing area regulating members can be replaced so that an area for pressing said wafer with said air bag is changed.

According to the present invention, pressing areas of the wafer can be easily changed by a simple operation, replacing the pressing area regulating members.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIGS. 8(A), 8(B) and 8(C) are schematic views showing states of a copper film deposited to the wafer.

DETAILED DESCRIPTION OF THE PREFERRED EMBODIMENTS

Hereunder the preferred embodiments for the wafer polishing apparatus of the present invention will be described in detail according to the accompanying drawings.

Figure 1:
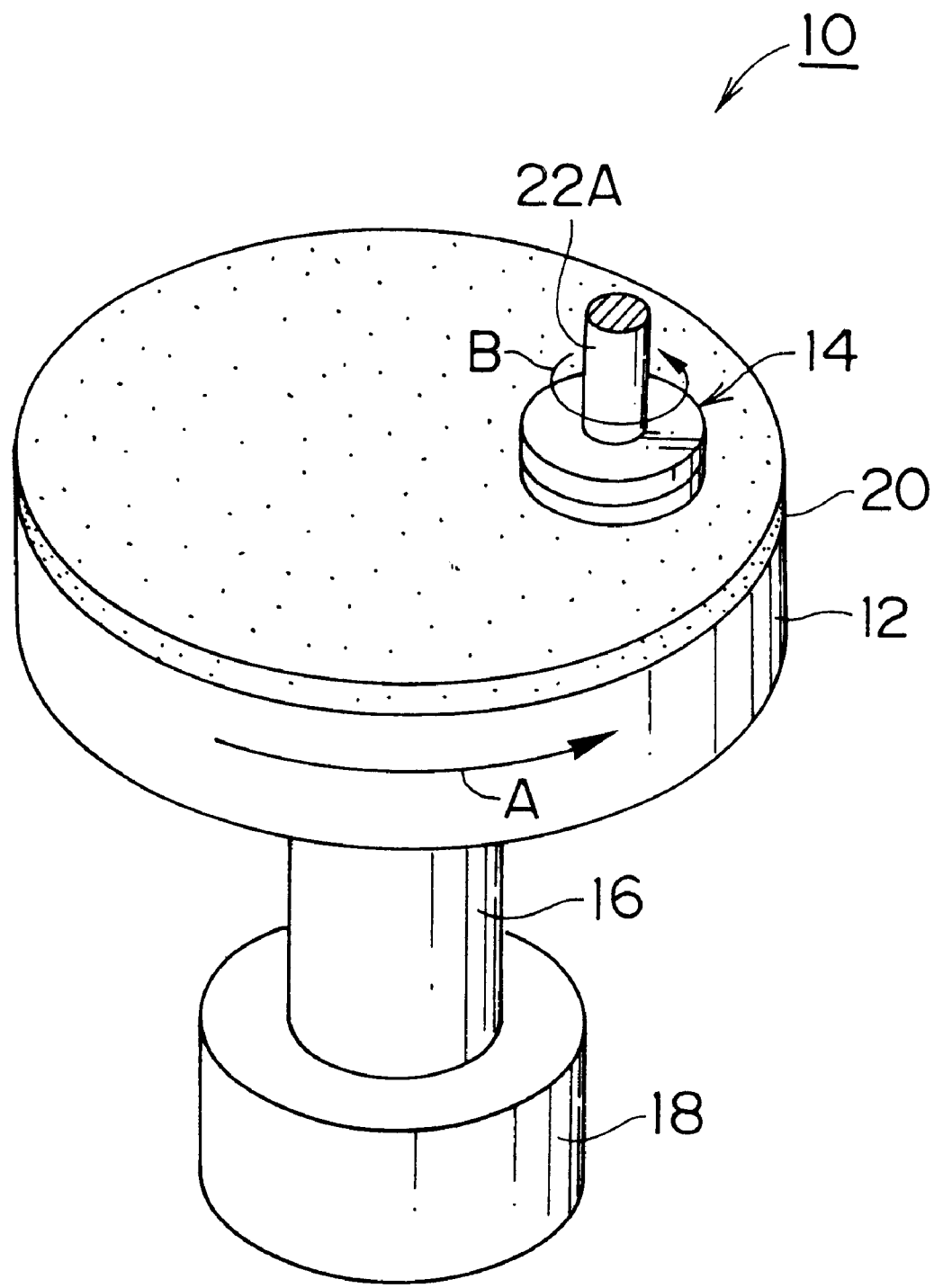
FIG. 1 is a perspective view showing an entire structure of a wafer polishing apparatus.

FIG. 1 is a perspective view showing an entire structure of a wafer polishing apparatus 10, which mainly comprises a platen 12 and a wafer holding head 14.

The disk-shaped platen 12 is connected to a rotary spindle 16 at its bottom center, and the platen 12 rotates by driving a motor 18 which is connected to the rotary spindle 16. Moreover, a polishing pad 20 is adhered on the top face of the platen 12. Slurry is supplied from a nozzle (not shown) onto the polishing pad 20.

Figure 2:
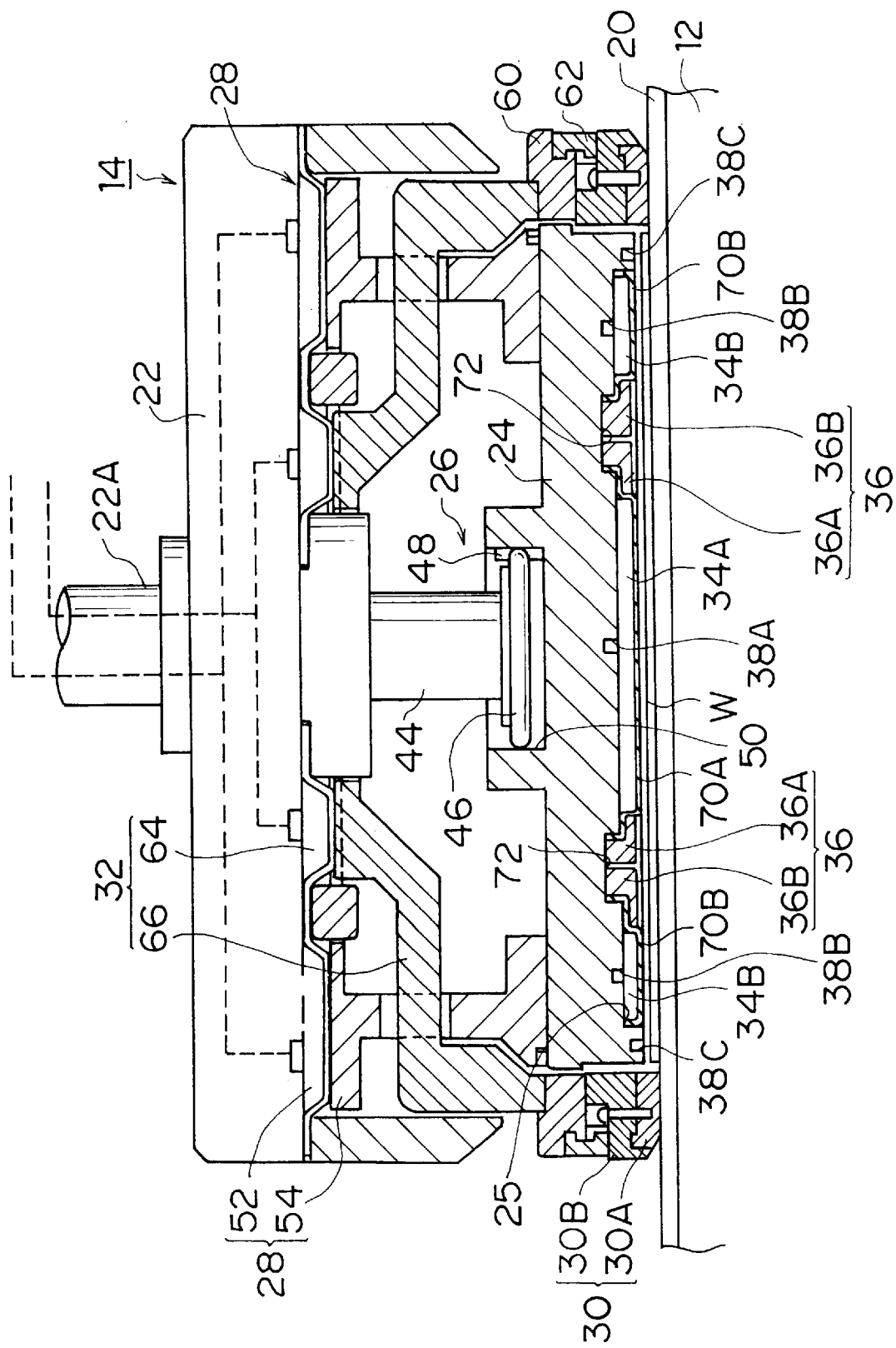
FIG. 2 is a vertical section view showing a structure of a wafer holding head.

As seen now from FIG. 2, the wafer holding head 14 mainly comprises a head body 22, a carrier 24, a carrier drive mechanism 26, a carrier pressing mechanism 28, a retainer ring 30, a retainer ring pressing mechanism 32, an air bag 34, and groups of pressing area regulating members 36.

The disk-shaped head body 22 is connected to a rotary spindle 22A at its top center, and the head body 22 rotates by driving a motor (not shown) which is connected to the rotary spindle 22A.

The disk-shaped carrier 24 is arranged at the bottom center of the head body 22. As seen from FIGS. 3 and 4, a plurality of third air spout openings 38C are formed in a predetermined interval at an outer periphery of the bottom face of the carrier 24. Moreover, a circular concave part 25 is formed at the center of the bottom face of the carrier 24. A first air spout opening 38A and a plurality of second air spout openings 38B are formed. The first air spout openings 38A are formed at the center of the concave part 25, whereas the second air spout openings 38B are formed in a predetermined interval at the outer periphery of the concave part 25. Moreover, air flow passages 40A, 40B, and 40C which are respectively connected to the respective air openings 38A, 38B, and 38C are formed inside the carrier 24. The air flow passages 40A, 40B, and 40C are independent from each other, and compressed air is supplied respectively to the air flow passages from an air supply apparatus (not shown).

Turning back to FIG. 2, the carrier drive mechanism 26 comprises a drive spindle 44, a drive plate 46, and a drive pin 48. The drive spindle 44 is a column, and is connected to the center of the bottom face of the head body 22 at its top end, while the drive plate 46 is connected to the bottom end of the drive spindle 44. The drive plate 46 is disk-shaped, and is coupled with a circular concave part 50, which is formed at the center of the top face of the carrier 24. The drive pin 48 is provided within the concave part 50, and the pin 48 is fit into a pin hole (not shown), which is formed at the drive plate 46.

According to the carrier drive mechanism 26 which has been constructed as described above, when the head body 22 rotates, its rotation is transmitted to the drive plate 46 through the drive spindle 44, and the rotation of the drive plate 46 is transmitted to the carrier 24 through the drive pin 48.

As seen from FIG. 2, the carrier pressing mechanism 28 comprises an air bag 52 for the carrier and a pressing member 54 for the carrier. The air bag 52 for the carrier is donut-shaped (ring-shaped) is arranged at an outer periphery of the bottom face of the head body 22. The air bag 52 is made of a rubber sheet, and it expands and contracts by supply and discharge of the air from the air supply apparatus (not shown). On the other hand, the bottom end of the cylindrical pressing member 54 for the carrier is fixed at the outer periphery of the top face of the carrier 24.

According to the carrier pressing mechanism 28 which has been constructed as described above, when expanding the air bag 52 for the carrier, the pressing member 54 for the carrier is pressed down by the air bag 52 for the carrier, causing the carrier 24 to be pressed down.

Figure 3:
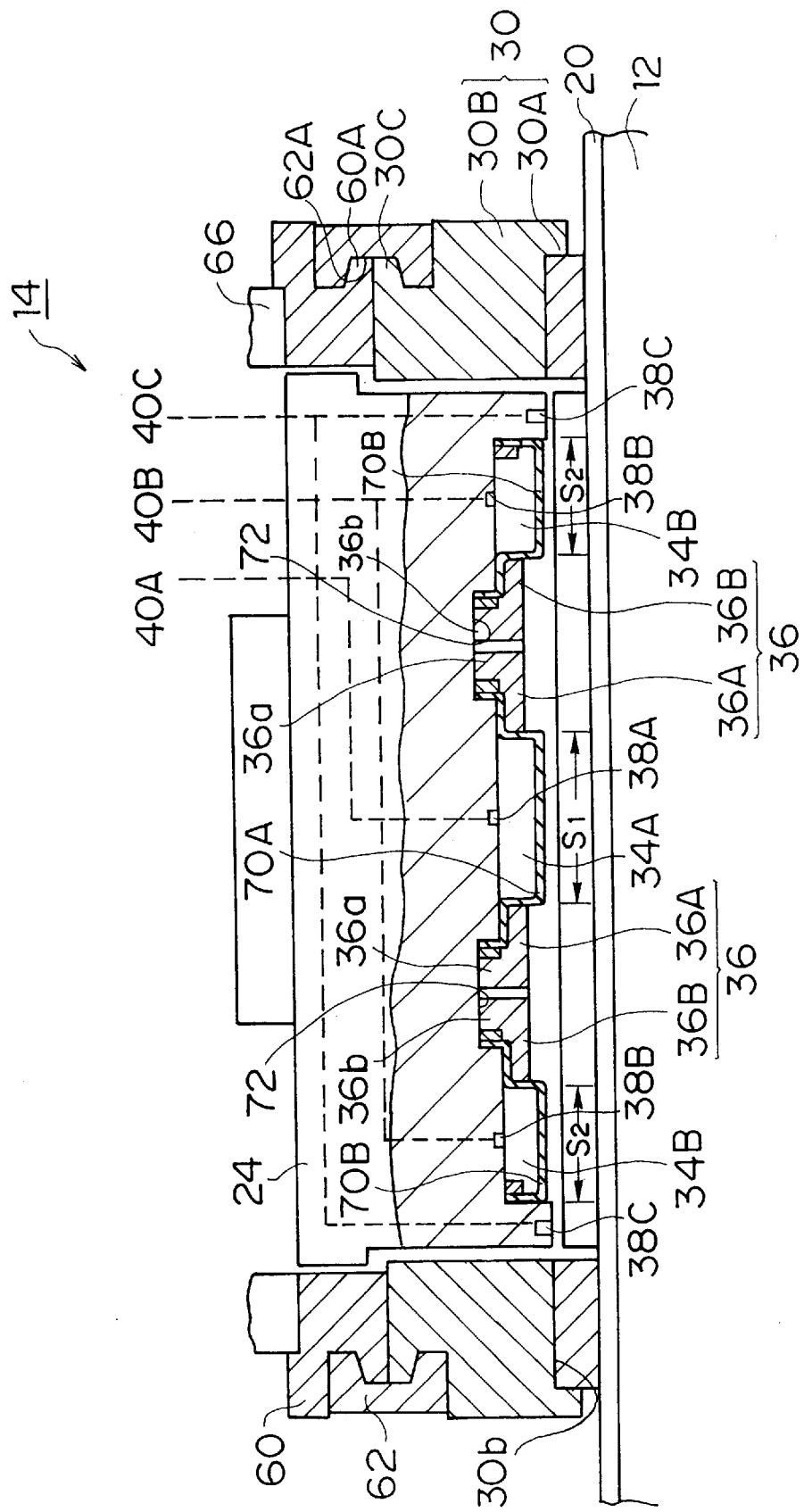
FIG. 3 is another vertical section view showing a structure with main parts of the wafer polishing apparatus.

As seen from FIG. 3, the retainer ring 30 comprising a retainer ring body 30A and a retainer ring holder 30B is arranged at the outer periphery of the carrier 24. The retainer ring body 30A is attached to the bottom of the cylindrical retainer ring holder 30B. A concave part 30b is formed at the bottom face of the retainer ring holder 30B, and the retainer ring body 30A is coupled with the concave part 30b whereby the retainer ring body 30A is attached to the retainer ring holder 30B. The retainer ring body 30A now attached to the retainer ring holder 30B is then fixed to the retainer ring holder 30B by screwing or adhering plural sections of the retainer ring body 30A.

The retainer ring 30 is also detachably attached with a snap ring 62 to an attachment ring 60 which is arranged on the outer periphery of the carrier 24. A groove 62A is formed on an inner periphery of the snap ring 62, and a flange 60A formed on an outer periphery of the bottom end of the attachment ring 60 as well as a flange 30C formed on an outer periphery of the top end of the retainer ring holder 30B are coupled to the groove 62A, whereby the attachment ring 60 and the retainer ring 30 become the same body.

As seen again from FIG. 2, the retainer ring pressing mechanism 32 comprises an air bag 64 for the retainer ring and a pressing member 66 for the retainer ring. The donut-shaped (ring-shaped) air bag 64 for the retainer ring is arranged at the center of the of the bottom face of the head body 22. The air bag 64 is made of a rubber sheet, and it expands and contracts by supply and discharge of the air from the air supply apparatus (not shown). On the other hand, the bottom end of the cylindrical pressing member 66 for the retainer ring is fixed to the top face of the attachment ring 60.

According to the retainer ring pressing mechanism 32 which has been constructed as described above, when expanding the air bag 64 for the retainer ring, the pressing member 66 for the retainer ring is pressed down by the air bag 64, causing the retainer ring 30 to be pressed down so as to be pressed against the polishing pad 20.

The air bag 34 is provided under the carrier 24, and it presses the top face of the wafer W so as to press the bottom face of the wafer W against the polishing pad 20. The air bag 34 comprises a central air bag 34A and an outer peripheral air bag 34B.

The central air bag 34A is constructed of a central rubber sheet 70A which is provided at the center of the bottom face of the carrier 24. An outer peripheral portion of the disk-shaped central rubber sheet 70A is fixed to an inner surface of an attachment groove 72, which is formed on the bottom face of the carrier 24. The central air bag 34A expands by spouting the compressed air into it from the first air spout opening 38A, which are formed on the bottom face of the carrier 24 in order to press the center of the top face of the wafer W.

The outer peripheral air bag 34B is constructed of an outer peripheral rubber sheet 70B, which is provided on the outer periphery of the bottom face of the carrier 24. An inner periphery of the donut-shaped (ring-shaped) outer peripheral rubber sheet 70B is fixed to an inner surface of the attachment groove 72, which is formed on the bottom face of the carrier 24, whereas its outer periphery is fixed to an inner surface of the concave part 25. The outer peripheral air bag 34B expands by spouting the compressed air into it from the second air spout openings 38B, which are formed on the bottom face of the carrier 24 in order to press the outer periphery of the top face of the wafer W.

Figure 4:
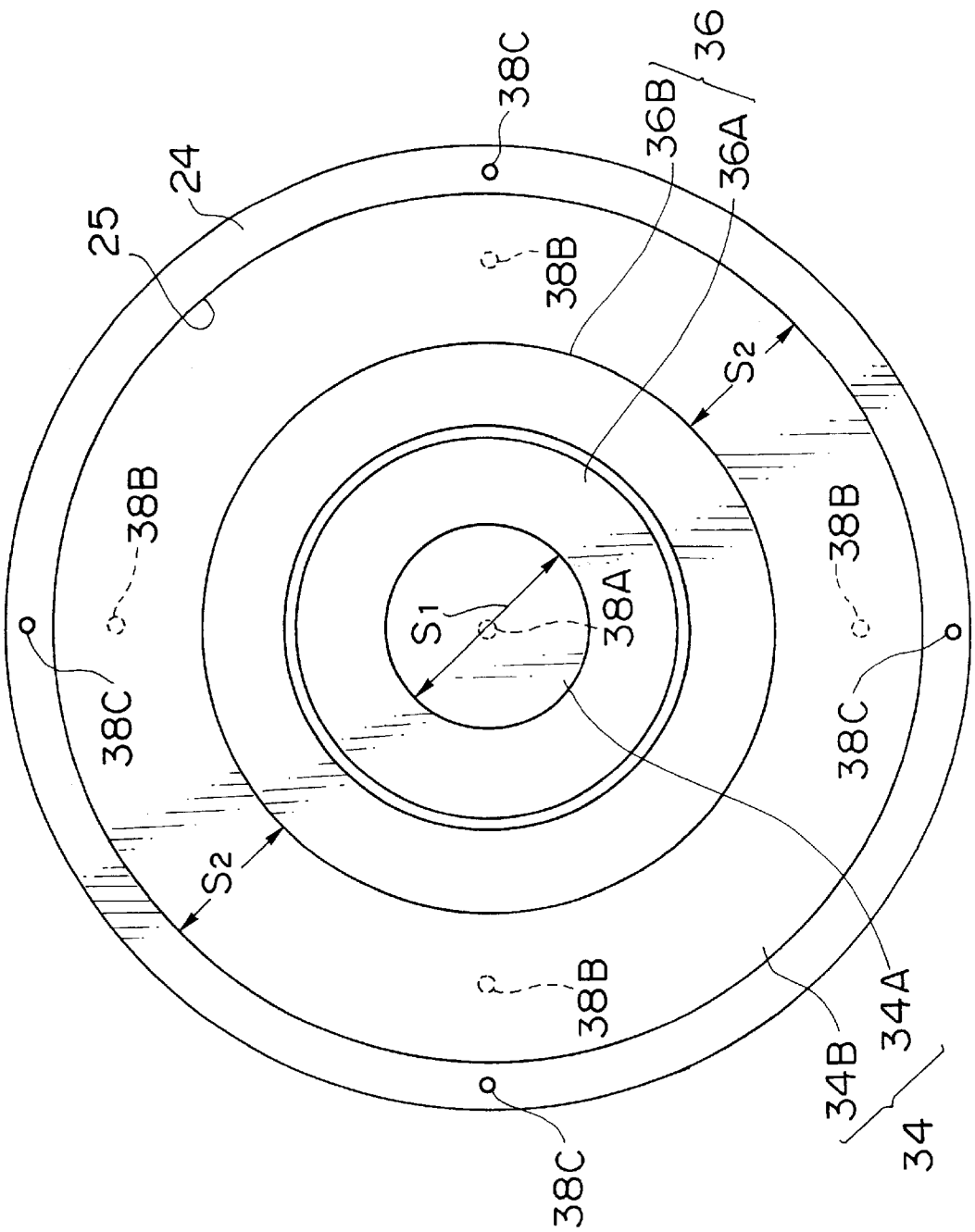
FIG. 4 is a bottom view of a carrier.

As seen from FIGS. 3 and 4, the pressing area regulating members 36 are attached to the bottom face of the carrier 24 in order to regulate pressing areas of the air bag 34. The pressing area regulating members 36 comprise central area regulating members 36A for regulating an area to be pressed by the central air bag 34A, and outer peripheral area regulating members 36B for regulating an area to be pressed by the outer peripheral air bag 34B.

As seen from FIGS. 3 and 4, the central area regulating members 36A are donut-shaped plates, and convex parts 36a are formed on outer peripheries of the top faces of the central area regulating members 36A. The convex parts 36a are attached to the bottom face of the carrier 24 by coupling them with the ring-shaped attachment groove 72, which is formed at the carrier 24. The central area regulating members 36A, now attached, are secured with bolts (not shown) at plural sections so as to be fixed to the carrier 24. The central area regulating members 36A cover a predetermined area of the outer periphery of the central air bag 34A in order to regulate an expanding area.

As seen from FIGS. 3 and 4, the outer peripheral area regulating members 36B are donut-shaped plates, and convex parts 36b are formed on inner peripheries of the top faces of the outer peripheral area regulating members 36B. The convex parts 36b are attached to the bottom face of the carrier 24 by coupling them with the ring-shaped attachment groove 72, which is formed at the carrier 24. The outer peripheral area regulating members 36B, now attached, are secured with bolts (not shown) at plural sections so as to be fixed to the carrier 24. The outer peripheral area regulating members 36B cover a predetermined area of the inner periphery of the outer peripheral air bag 34B in order to regulate an expanding area.

The central area regulating members 36A with different diameters and the outer peripheral area regulating members 36B with different diameters are prepared, and pressing areas are regulated by replacing the regulating members when suitable.

An operation of the wafer polishing apparatus 10 in the present embodiment which has been constructed as presented above will hereunder be described.

First, the wafer W is mounted on the polishing pad 20. Second, the retainer ring 30 is pressed against the polishing pad 20 by expanding the air bag 64 for the retainer ring, and the wafer W is surrounded by the retainer ring 30.

Then, the top face of the wafer W is pressed with the carrier 24 in a predetermined pressure. In this operation, the compressed air is spouted from the third air spout openings 38C so as to form an air layer between the carrier 24 and the wafer W. The compressed air is then supplied to the air bag 52 for the carrier so as to press the carrier 24 under a predetermined pressing force. The entire surface of the wafer W is thereby uniformly pressed with the carrier 24.

If there is a difference in thicknesses of a film on the wafer W to be pressed at that point, the compressed air is supplied to the central air bag 34A and the outer peripheral air bag 34B in order to adjust the thicknesses of the film. For example, if more film is deposited, that is, the film is thicker at the center and on the outer periphery than the other parts as shown in FIG. 8(A), the compressed air is supplied into the central air bag 34A and the outer peripheral air bag 34B. By this operation a pressing force (P1) of a first area S1 where the central air bag 34A is provided as well as a pressing force (P2) of a second area S2 where the outer peripheral air bag 34B is provided both increases. If more film is deposited, that is, the film is thicker only at the center as shown in FIG. 8(B), the compressed air is supplied into the central air bag 34A so that the pressing force P1 of the first area S1 increases where the central air bag 34A is provided. If more film is deposited, that is, the film is thicker only on the outer periphery as shown in FIG. 8(C), the compressed air is supplied into the outer peripheral air bag 34B so that the pressing force P2 for the second area S2 increases where the outer peripheral air bag 34B is provided.

As presented above, if there is a difference in thicknesses of the film of the wafer W, the compressed air is supplied to the central air bag 34A and the outer peripheral air bag 34B so as to adjust the thicknesses of the film, then the wafer W is polished by varying a degree of the pressing forces at different areas. The platen 12 is rotated in the direction of an arrow A in FIG. 1 in that state and at the same time the wafer holding head 14 is rotated in the direction of an arrow B in FIG. 1, then a slurry is supplied onto the rotating polishing pad 20 form a nozzle (not shown). Thereby, the wafer W is polished by the polishing pad 20.

As described above, since a degree of the pressing forces can be varied in the wafer polishing apparatus 10 in the present embodiment, removing amounts can be differed depending on parts of the wafer; hence the wafer W with different thicknesses of film can be polished so that the final thicknesses of the film is uniform.

Pressing forces and pressing time lengths of the central air bag 34A and the outer peripheral air bag 34B are so controlled as to correspond with the differences in thicknesses of the film on the wafer W to be polished. In this operation, the pressing forces and the pressing time lengths are controlled so that the final thicknesses of the entire film is uniform and films of unnecessary parts can be removed.

Figure 5:
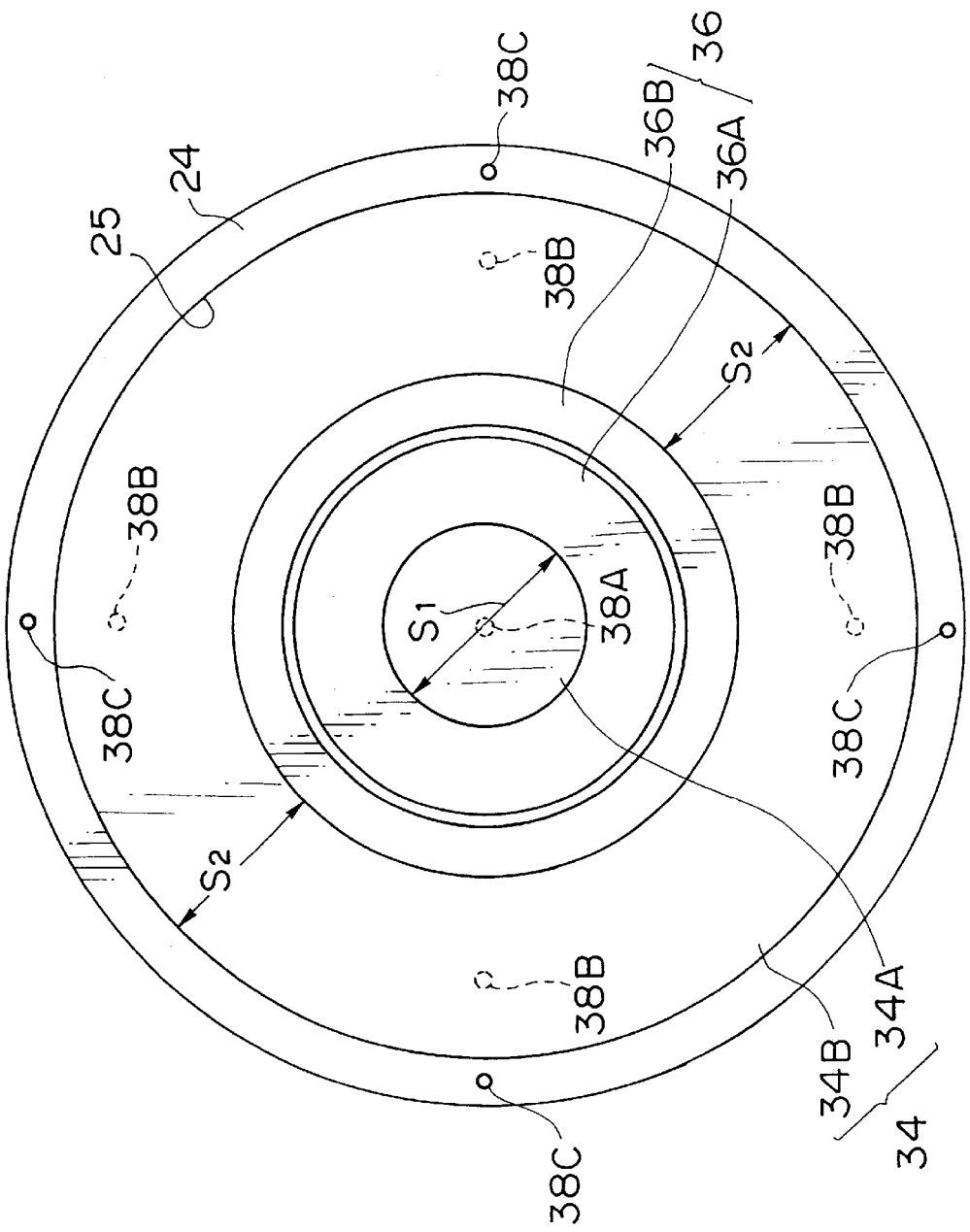
FIG. 5 is another bottom view of the carrier in another embodiment.
Figure 6:
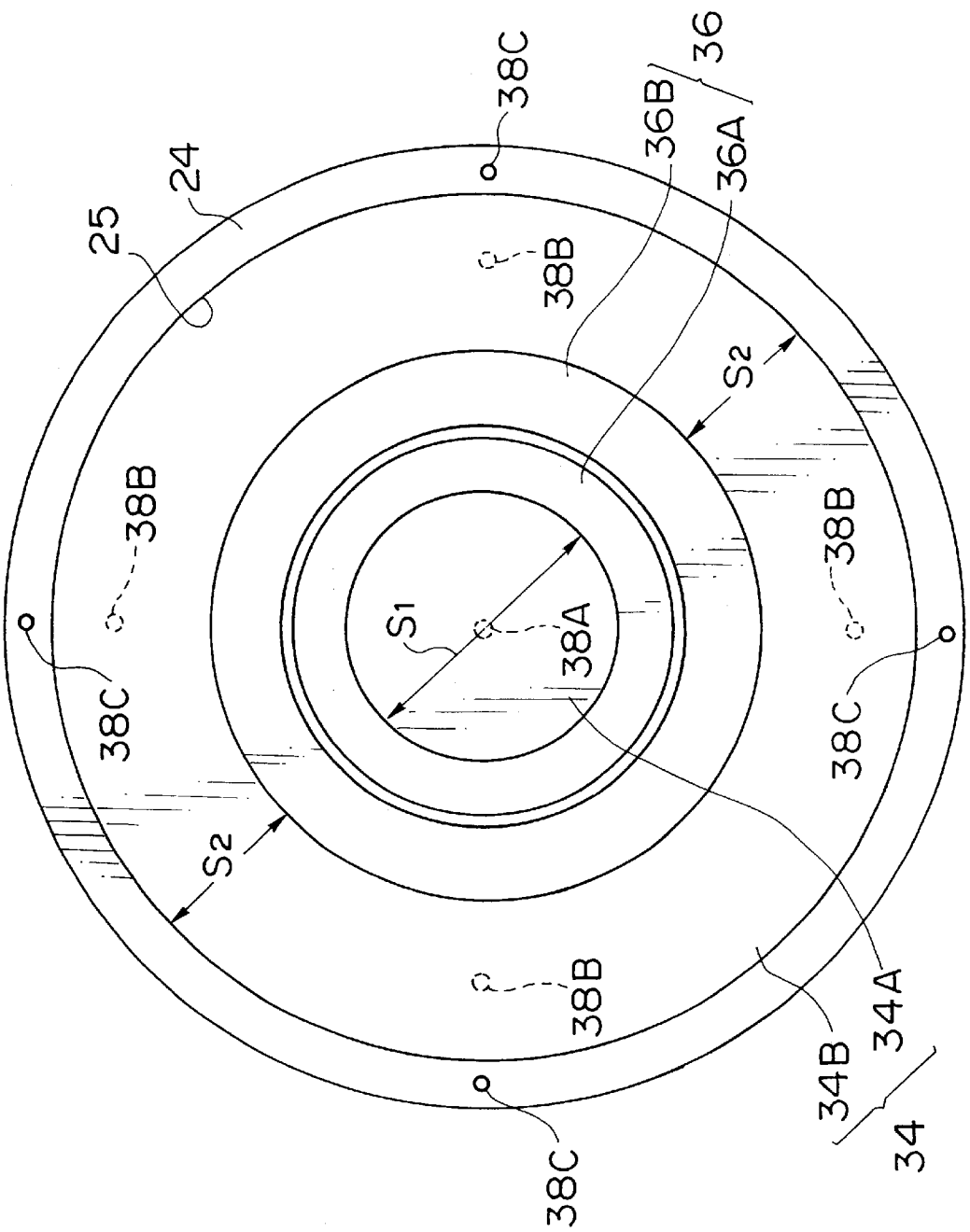
FIG. 6 is yet another bottom view of the carrier in the other embodiment.

In the wafer polishing apparatus in the present embodiment, ranges of the central air bag 34A and the outer peripheral air bag 34B for pressing the wafer W can be respectively as well as individually changed, by replacing the pressing area regulating members 36. For example, in order to extend a range, the second area S2, for pressing the wafer W with the outer peripheral air bag 34B, the outer peripheral area regulating members 36B, currently used, is replaced by another one which has a small outer diameter, as shown in FIG. 5. In order to extend a range, the first area S1 for pressing the wafer W with the central air bag 34A, the central area regulating member 36A, currently used, is replaced by another one which has a small inner diameter, as shown in FIG. 6. Since these replacements are done by attachment and detachment through bolts (not shown), the replacements can be accomplished not only easily but also in a short time.

As described above, according to the wafer polishing apparatus 10 in the present embodiment, areas for pressing the wafer W can be easily changed, and also the pressing forces can be individually controlled for each area. Thus, the wafer W can be planarized with a high accuracy.

In the present embodiment, the air bag 34 for pressing the wafer has two air bags: the central air bag 34A and the outer peripheral air bag 34B. However, the number of the air bags is not limited to that. More air bags may be used so that the distribution of the pressing forces can be controlled even more precisely.

The shape of the pressing area regulating member is not limited to the donut-shape; it may be suitably changed depending on the use.

Figure 7:
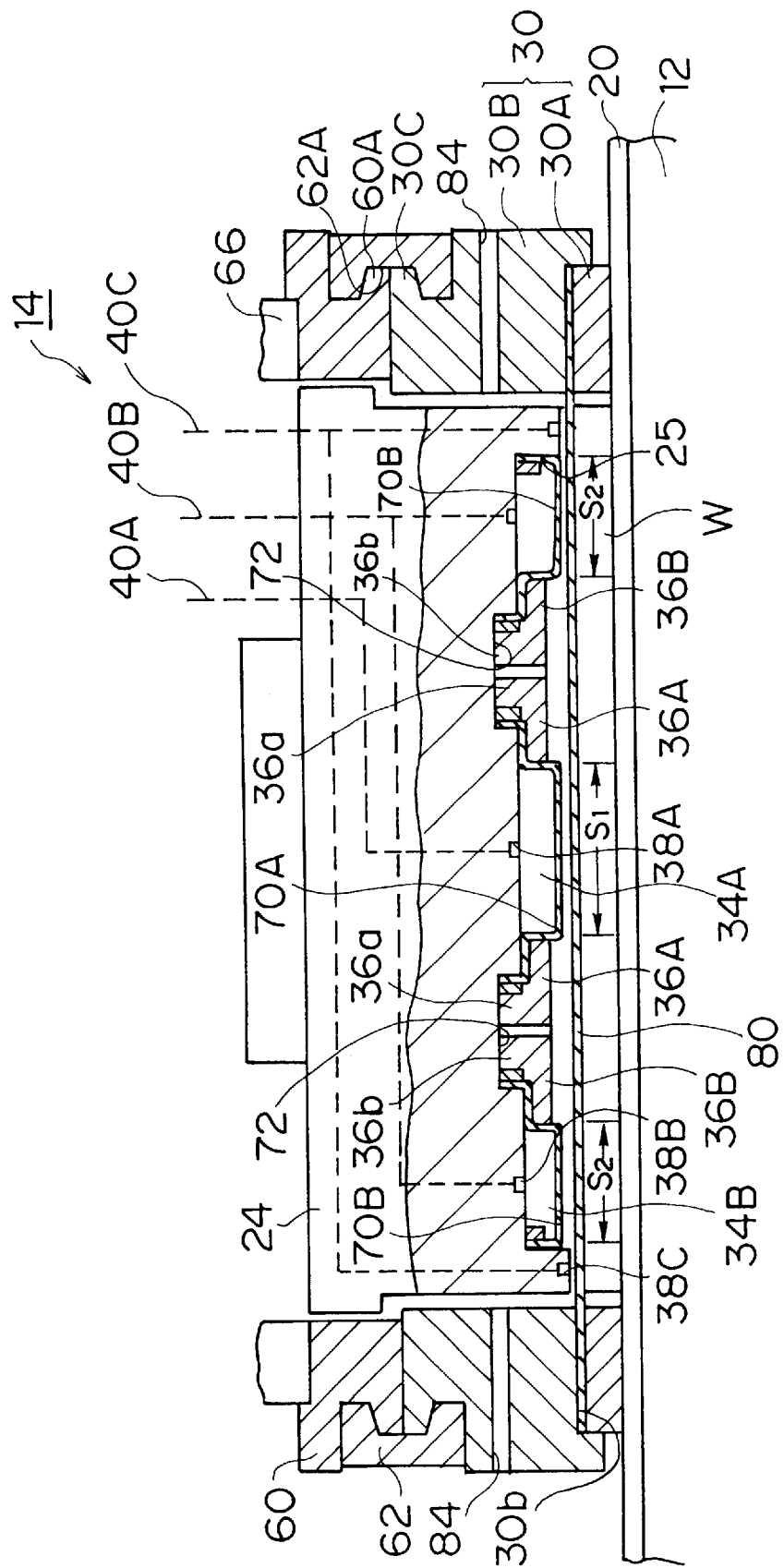
FIG. 7 is a vertical section view showing a structure with main parts of the wafer polishing apparatus in a second embodiment.

FIG. 7 is a vertical section view which shows a structure of the main parts of the wafer polishing apparatus in the second embodiment of the present invention. The same members as those mentioned in the first embodiment have the same numbers and characters with the wafer polishing apparatus 10 in the first embodiment.

In the wafer polishing apparatus 10 in the present embodiment in FIG. 7, a protection sheet 80 is tensioned at the inside of the retainer ring 30, and the wafer W is pressed with the air bag 34 through the protection sheet 80.

The protection sheet 80 is disk-shaped and an outer periphery of the protection sheet 80 is pinched between the retainer ring body 30A and the retainer ring holder 30B whereby it is tensioned at the inside of the retainer ring 30. The compressed air supplied from the third air spout openings 38C forms an air layer between the protection sheet 80 and the carrier 24, and the wafer W is pressed against the polishing pad 20 through the air layer. In other words, the air layer formed between the protection sheet 80 and the carrier 24 presses the protection sheet 80, which then presses the wafer W, causing the wafer W to be then pressed against the polishing pad 20.

Air holes 84, 84, . . . are formed on the inner and outer peripheral faces of the retainer ring holder 30B in predetermined intervals, and the compressed air being supplied from the third air spout openings 38C is exhausted through the air holes 84.

An operation of the wafer polishing apparatus which has been constructed as presented above will be described hereunder.

First, the wafer W is mounted on the polishing pad 20. Second, the retainer ring 30 is pressed against the polishing pad 20 by expanding the air bag 64 for the retainer ring, and the wafer W is surrounded by the retainer ring 30. Then the top face of the wafer W is pressed with the carrier 24 in a predetermined pressure. In this operation, the compressed air is spouted from the third air spout openings 38C, and an air layer (an air pressure in the air layer is 29.4 kPa–68.6 kPa=0.3 kgf/cm$^2$–0.7 kgf/cm$^2$) is formed between the carrier 24 and the protection sheet 80. Then, the compressed air is supplied into the air bag 52 for the carrier and the carrier 24 is pressed in a predetermined pressing force. Thereby the entire surface of the wafer W is uniformly pressed.

If there is a difference in thicknesses in a film of the wafer W to be polished at that point, the compressed air is supplied into the central air bag 34A and the outer peripheral air bag 34B in order to adjust the thicknesses of the film of the wafer W. In this state, the platen 12 is rotated in the direction of the arrow A in FIG. 1 and at the same time the wafer holding head 14 is rotated in the direction of the arrow B in FIG. 1, then the slurry is supplied to the rotating polishing pad 20 from the nozzle (not shown). Thereby the wafer W is polished by the polishing pad 20.

As described above, the pressing forces can be distributed in the wafer polishing apparatus in the present embodiment, too. Thus, the wafer polishing apparatus can polish the wafer W to have the final thicknesses of the film uniform even in a case for polishing the wafer W with a difference in the thicknesses of the film.

Moreover, since the wafer polishing apparatus in the present embodiment presses the wafer W through the protection sheet 80, scratches caused by direct contacts of the top face of the wafer W with the carrier 24 can be effectively prevented.

Further, the distribution of the pressing force can be easily changed in the wafer polishing apparatus in the present embodiment by replacing the pressing area regulating members 36. Although the protection sheet 80 must be detached when replacing the pressing area regulating members 36, the protection sheet 80 is attached to the retainer ring 30; thus the regulating members 36 can be easily detached together with the retainer ring 30 only by detaching the snap ring 62.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wafer polishing apparatus in which a wafer is pressed against a polishing pad so as to polish the wafer, comprising:

a carrier;

air spout openings provided to a bottom of said carrier, said air spout openings spouting air so as to form an air layer between said carrier and said wafer in order to press the wafer against the polishing pad by the air layer to polish the wafer;

air bags provided to the bottom of said carrier for forming said air layer and for partially pressing a top face of said wafer; and pressing area regulating members which are detachably attached to the bottom of said carrier for regulating an area where said air bag presses the top face of said wafer, wherein said pressing area regulating members regulate different areas to be pressed, and said pressing area regulating members can be replaced so that an area for pressing said wafer with said air bag is changed.

2. The wafer polishing apparatus as defined in claim 1, further comprising a retainer ring which is provided to an outer periphery of said carrier.

3. The wafer polishing apparatus as defined in claim 2, further comprising:

a sheet tensioned inside the retainer ring, wherein said wafer is pressed with said air bags through the sheet, and an air layer is formed between said carrier and said sheet by spouting the air from said air spout openings, which are formed at the bottom face of said carrier, thereby said wafer is pressed with said air layer through said sheet.

4. The wafer polishing apparatus as defined in claim 3, further comprising an attaching member which is provided to the outer periphery of said carrier.

5. The wafer polishing apparatus as defined in claim 4, wherein said retainer ring is detachable from the attaching member.

* * * * *